United States Patent [19]
Jiang

[11] Patent Number: 5,339,270
[45] Date of Patent: Aug. 16, 1994

[54] AC DRAIN VOLTAGE CHARGING SOURCE FOR PROM DEVICES

[75] Inventor: Chun Jiang, San Jose, Calif.

[73] Assignee: VLSI Technology, Inc., San Jose, Calif.

[21] Appl. No.: 82,124

[22] Filed: Jun. 23, 1993

[51] Int. Cl.$^5$ .............................................. G11C 11/40
[52] U.S. Cl. .................................... 365/185; 365/45; 365/189.09
[58] Field of Search ................. 365/182, 184, 185, 45, 365/218, 189.09

[56] References Cited

U.S. PATENT DOCUMENTS

| | | | |
|---|---|---|---|
| 4,057,788 | 11/1977 | Sage | 365/185 |
| 4,279,024 | 7/1981 | Schrenk | 365/218 |
| 4,449,205 | 5/1984 | Hoffman | 365/182 |
| 5,239,500 | 8/1993 | Oguey | 365/185 |

OTHER PUBLICATIONS

E. Säckinger et al., "An Analog Trimming Circuit Based on a Floating-Gate Device," IEEE Journal of Solid-State Circuits, vol. 23 #6, Dec. 1988, pp. 1437-1440.

Y. Yamauchi, et al, "A 5V-Only Virtual Ground Flash with An Auxiliary Gate for High Density and High Speed Application", IEDM Dec. 1991, p. 11.7.1.

N. Kodama, et al., "A Symmetrical Side Wall(SSW-)-DSA Cell for a 64Mbit Flash Memory", IEDM, Dec. 1991, p. 11.3.1.

Primary Examiner—Joseph E. Clawson, Jr.
Attorney, Agent, or Firm—Douglas L. Weller

[57] ABSTRACT

A method for programming a programmable read only memory (PROM) is useful for a PROM which has a source, a drain and a control gate. A DC signal is placed on the control gate. For example, the DC signal has a voltage of approximately 5 volts. An AC signal is placed on the drain. The AC signal, for example, oscillates between approximately 0 volts and 5 volts and has a frequency of at least 100 Megahertz. As a result, charges tunnel through a tunnel oxide region to an floating gate, thus programming the PROM.

4 Claims, 3 Drawing Sheets

AC DRAIN VOLTAGE CHARGING SOURCE FOR PROM DEVICES

BACKGROUND

This invention relates generally to the programming of programmable read-only memories, such as erasable programmable read-only memories (EPROMs).

In the prior art, EPROMs are generally programmed using high DC voltages. For example, when programming an EPROM, in order to program a floating gate of the EPROM, a voltage of 15 volts is placed on the gate, a voltage of 5 volts is placed on the drain and a voltage of 0 volts is placed on the source. When erasing the EPROM, a negative voltage with high negative magnitude (e.g. 11 volts) is placed on the control gate. The programming and erasing results, for example, from current tunneling or current injection. See, for example, Y. Yamauchi, et al, "A 5V-Only Virtual Ground Flash Cell with An Auxiliary Gate for High Density and High Speed Application", IEDM, 1991, p. 11.7.1, or N. Kodama, et al., "A Symmetrical Side Wall(SSW)-DSA Cell for a 64Mbit Flash Memory", IEDM, 1991, p. 11.3.1.

The programming methods of the prior art have several drawbacks. For example, a high voltage source is needed to perform the programming. Also, EPROMs programmed according to the prior art often lack in endurance.

SUMMARY OF THE INVENTION

In accordance with the preferred embodiment of the present invention, a method for programming a programmable read only memory (PROM) is presented. The PROM has a source, a drain and a control gate. A DC signal is placed on the control gate. For example, the DC signal has a voltage of approximately 5 volts. An oscillating signal is placed on the drain. The oscillating signal, for example, oscillates between approximately 0 volts and 5 volts and has a frequency of at least 100 MHz. As a result, hot electron charges migrate through a tunnel oxide region to a floating gate, thus programming the PROM.

The present invention has several advantages over the prior art. For example, the present invention allows for a reduced gate and drain voltage amplitude during programming. The present invention also provides for more reliable operation of PROMs by avoiding hot holes being injected into the gate oxide. Additionally, the present invention allows for optimization of the oscillating frequency and pulse to increase programming efficiency.

DESCRIPTION OF THE PRIOR ART

Figure 1:
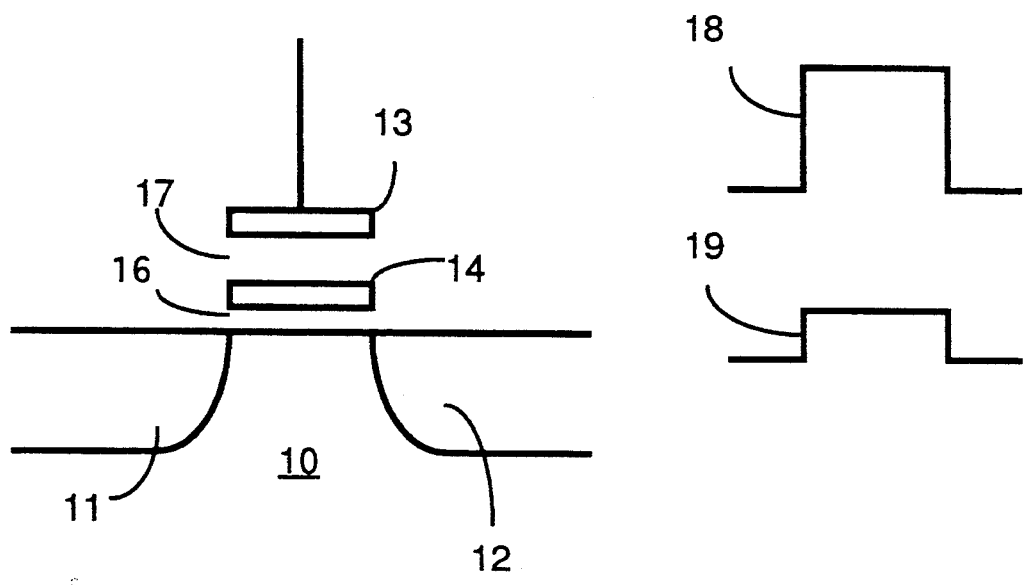
FIG. 1 illustrates programming of an EPROM in accordance with the prior art.

FIG. 1 illustrates programming of an EPROM in accordance with the prior art. The EPROM includes a source 11, a drain 12 and a control gate 13. For example, source 11 is composed of n+ type material doped at $5 \times 10^{15}$ per centimeter$^2$ or greater. Drain 12 is composed of n+ type material doped at $1 \times 10^{15}$ centimeter$^2$ or less. Source 11 and drain 12 are within a substrate 10 of, for example, p-type material. Control gate 13 is composed of, for example, polysilicon. A floating gate 14 is composed of, for example, polysilicon. Floating gate 14 is electrically isolated from control gate 13 by an inter-poly oxide region 17. Inter-poly oxide region 17 is, for example, 16 nanometers thick and is composed of silicon-oxide. Tunnel oxide region 16 electrically isolates floating gate 14 from substrate 10, source 11 and drain 12. Tunnel oxide region 16 is, for example, 8 nanometers thick and is composed of silicon-oxide.

In the prior art, floating gate 14 is programmed, for example, by placing a 0 volt DC signal on drain 12 and source 11, as represented by waveform 19, and by placing a 15 volt DC signal on control gate 13. This results in current tunneling through tunnel oxide region 16 to floating gate 14.

Alternately, in the prior art, floating gate 14 can be programmed, by placing a 7 volt DC signal on drain 12, as represented by waveform 19, by placing 0 volts on source 11 and by placing a 15 volt DC signal on control gate 13. This results in high energy electrons tunneling through tunnel oxide region 16 to floating gate 14.

DESCRIPTION OF THE PREFERRED EMBODIMENT

Figure 2:
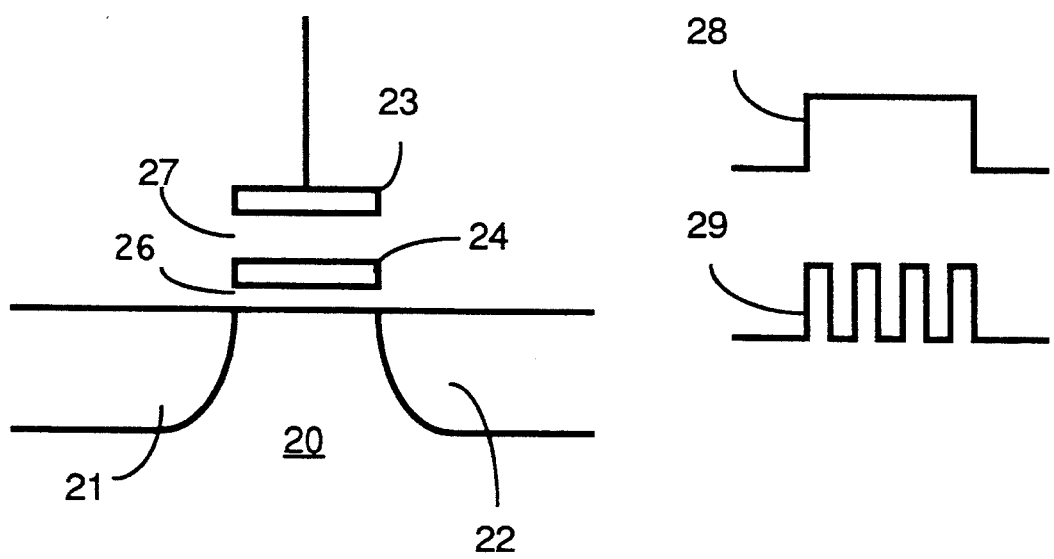
FIG. 2 illustrates programming of an EPROM in accordance with the preferred embodiment of the present invention.

FIG. 2 illustrates programming of an EPROM in accordance with the preferred embodiment of the present invention. The EPROM includes a source 21, a drain 22 and a control gate 23. For example, source 21 is composed of n+ type material doped at least $5 \times 10^{15}$ per centimeter$^2$ or greater. Drain 22 is composed of n+ type material doped at $\times 10^{15}$ centimeter$^2$ or less. Source 21 and drain 22 are within a substrate 20 of, for example, p-type material. Control gate 23 is composed of, for example, polysilicon. A floating gate 24 is composed of, for example, polysilicon. Floating gate 24 is electrically isolated from control gate 23 by an inter-poly oxide region 27. Inter-poly oxide region 27 is, for example, 16 nanometers thick and is composed of silicon-oxide. Tunnel oxide region 26 electrically isolates floating gate 24 from substrate 20, source 21 and drain 22. Tunnel oxide region 26 is, for example, 8 nanometers thick and is composed of silicon-oxide.

In the preferred embodiment, floating gate 24 is programmed, for example, by placing a 5 volt DC signal on control gate 23, as represented by a waveform 28, and by placing a 0 to 5 volt oscillating signal on drain 22 by a waveform 29. For example, the oscillating signal oscillates at a frequency of at least 100 MHz. When the voltage (Vd) on drain 22 is at 5 volts, high energy (hot) electrons are generated in the drain region and an equilibrium state is maintained. When Vd drops to 0 volts, due to the sudden lowering of the gate oxide barrier, the hot electrons in the drain regions can tunnel into the floating gate, before they have enough time to lose their energies.

The success of this programming process depends on achieving a short fall time of Vd from 5 volts to 0 volts. Preferably the fall time should be 0.1 picoseconds or less. In general, the fall time should be less than the hot electron relaxation time. The structure design of the preferred embodiment can be optimized by providing for a structure which allows hot electrons to easily tunnel through tunnel oxide region 26 to floating gate 24.

Figure 3:
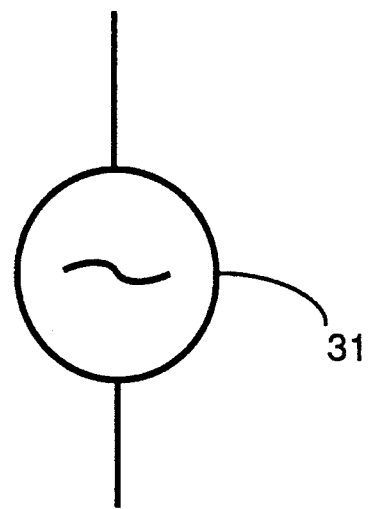
FIG. 3 shows a block diagram of an oscillator.

FIG. 3 shows an oscillator 31 which generates the oscillating signal on drain 22.

The foregoing discussion discloses and describes merely exemplary methods and embodiments of the present invention. For example, the discussion of the preferred embodiment describes an EPROM built on a substrate of p-conductivity type. As will be clearly understood by those skilled in the art, the present invention could work with other types of PROMs which are, for example, built on a substrate of n-conductivity type.

Therefore, as will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for programming a programmable read only memory having a source, a drain, a floating gate and a control gate, wherein the floating gate region is separated from the drain by a tunnel oxide region, the method comprising the steps of:
   (a) placing a DC signal on the control gate; and
   (b) placing an oscillating signal on the drain, wherein an oscillating frequency and a fall time for the oscillating signal are selected so that upon the oscillating signal reaching a minimum voltage, hot electrons at the drain tunnel through the tunnel oxide region to the floating gate, thereby charging the floating gate.

2. A method as in claim 1 wherein, in step (a) the DC signal has a voltage of approximately 5 volts.

3. A method as in claim 1 wherein in step (b), the oscillating signal oscillates between approximately 0 volts and 5 volts and has a frequency greater than 100 Megahertz.

4. A method as in claim 1 wherein, in step (b), the oscillating signal fall time from high voltage to low voltage is less than or equal to 0.1 pico-second.

* * * * *